(12) United States Patent
Ma et al.

(10) Patent No.: US 10,521,039 B2
(45) Date of Patent: Dec. 31, 2019

(54) METHOD FOR MANUFACTURING FLEXIBLE TOUCH DISPLAY PANEL

(71) Applicant: HannsTouch Solution Incorporated, Tainan (TW)

(72) Inventors: Shi-Wei Ma, Tainan (TW); Ching-Feng Tsai, Tainan (TW)

(73) Assignee: HannsTouch Solution Incorporated, Tainan (TW)

( * ) Notice: Subject to any disclaimer, the term of this patent is extended or adjusted under 35 U.S.C. 154(b) by 0 days.

(21) Appl. No.: 16/392,646

(22) Filed: Apr. 24, 2019

(65) Prior Publication Data
US 2019/0250750 A1    Aug. 15, 2019

Related U.S. Application Data

(62) Division of application No. 15/424,897, filed on Feb. 6, 2017, now Pat. No. 10,318,030.

(30) Foreign Application Priority Data

Dec. 6, 2016 (CN) ............ 2016 1 1110953

(51) Int. Cl.
| | |
|---|---|
| G06F 3/041 | (2006.01) |
| G06F 3/044 | (2006.01) |
| H01L 51/00 | (2006.01) |
| H01L 27/32 | (2006.01) |
| H01L 51/52 | (2006.01) |

(52) U.S. Cl.
CPC ............ *G06F 3/0412* (2013.01); *G06F 3/044* (2013.01); *H01L 27/323* (2013.01); *H01L 51/0097* (2013.01); *H01L 51/5253* (2013.01); *G06F 2203/04102* (2013.01); *G06F 2203/04103* (2013.01); *H01L 27/3244* (2013.01); *H01L 2251/5338* (2013.01); *H01L 2251/566* (2013.01)

(58) Field of Classification Search
CPC ............. G06F 3/0412; G06F 3/044; G06F 2203/04103; G06F 2203/04102; H01L 51/5253; H01L 27/323; H01L 51/0097; H01L 27/3244; H01L 2251/5338; H01L 2251/566
See application file for complete search history.

(56) References Cited

U.S. PATENT DOCUMENTS

| | | | | |
|---|---|---|---|---|
| 2014/0020542 A1* | 1/2014 | Heo | ............ | B26D 3/00 83/862 |
| 2014/0346473 A1* | 11/2014 | Park | ............ | H01L 51/5256 257/40 |

(Continued)

*Primary Examiner* — Amit Chatly
(74) *Attorney, Agent, or Firm* — Winston Hsu (57) ABSTRACT

A method for manufacturing a flexible touch display panel is provided. First, a display mother substrate including a plurality of first pad sets and a flexible touch mother substrate including a plurality of second pad sets are provided. Next, a plurality of first openings are formed in the display mother substrate, and a plurality of second openings are formed in the flexible touch mother substrate. Then, the flexible touch mother substrate is adhered to the display mother substrate by an adhesive layer, in which each first opening exposes one of the second pad sets respectively, and each second opening exposes one of the first pad sets respectively. Afterward, a cutting process is performed to form a plurality of touch display units.

14 Claims, 11 Drawing Sheets

(56) References Cited

U.S. PATENT DOCUMENTS

| | | | |
|---|---|---|---|
| 2015/0185942 A1* | 7/2015 | Kim | G06F 3/0412 |
| | | | 345/173 |
| 2015/0309637 A1* | 10/2015 | Sakuishi | G06F 3/0412 |
| | | | 345/174 |
| 2017/0054104 A1* | 2/2017 | Go | H01L 51/5246 |
| 2017/0199609 A1* | 7/2017 | Lee | G06F 3/0412 |

* cited by examiner

METHOD FOR MANUFACTURING FLEXIBLE TOUCH DISPLAY PANEL

CROSS REFERENCE TO RELATED APPLICATIONS

This application is a divisional application of U.S. patent application Ser. No. 15/424,897, filed Feb. 6, 2017.

BACKGROUND OF THE INVENTION

1. Field of the Invention

The present invention relates to a method for manufacturing a flexible touch display panel, and more particularly, to a method for manufacturing a flexible organic light-emitting touch display panel to shrink assembly process steps.

2. Description of the Prior Art

With the advance of technology, the flexible touch display panels having both the touch function as well as the display function have been widely applied to products for daily use. In general, the flexible organic light-emitting touch display panel is formed by adhering a flexible touch panel to an organic light-emitting display panel. However, the prior method for manufacturing the flexible touch display panel is to cut a flexible touch mother substrate formed with a plurality of touch panel devices into a plurality of flexible touch panels and cut a flexible display mother substrate into a plurality of flexible display panels and then to bond flexible circuit boards to the flexible touch panels and the flexible display panels respectively before adhering the flexible touch panels to the flexible display panels respectively, so the formed flexible touch panel and the formed flexible display panel should be adhered to each other one by one. Accordingly, the process steps for manufacturing the flexible touch display panel are complex and time-wasting, thereby increasing manufacturing cost.

SUMMARY OF THE INVENTION

It is therefore one of the objectives of the present invention to provide a method for manufacturing a flexible touch display panel to simplify the process steps for manufacturing the flexible touch display panel and reduce the manufacturing time and manufacturing cost.

An embodiment of the present invention provides a method for manufacturing a flexible touch display panel, including the following steps. First, a display mother substrate and a flexible touch mother substrate are provided. The display mother substrate includes a first substrate, a plurality of display panel devices and a plurality of first pad sets, each display panel device is disposed corresponding to one of the first pad sets respectively, and the display panel devices and the first pad sets are disposed on the first surface of the first substrate. The flexible touch mother substrate includes a second substrate, a plurality of touch panel devices and a plurality of the second pad sets, each touch panel device is disposed corresponding to one of the second pad sets respectively, and the touch panel devices and the second pad sets are disposed between the first substrate and the second substrate. Then, a plurality of first openings are formed in the display mother substrate, and a plurality of second openings are formed in the flexible touch mother substrate. Thereafter, the flexible touch mother substrate is adhered to the display mother substrate by an adhesive layer with the first surface of the first substrate facing the second surface of the second substrate as well as each display panel device being disposed corresponding to one of the touch panel devices respectively to form a mother substrate assembly. The adhesive layer does not overlap the first pad sets and the second pad sets in a vertical projection direction. Each first opening exposes one of the second pad sets respectively, and each second opening exposes one of the first pad sets respectively. Afterward, the mother substrate assembly is cut to separate the display panel devices from each other so as to form a plurality of touch display units. Next, a plurality of first circuit boards are adhered and electrically connected to the first pad sets respectively through the second openings, and a plurality of second circuit boards are adhered and electrically connected to the second pad sets respectively through the first openings to form a plurality of flexible touch display panels.

In the method for manufacturing the flexible touch display panel of the present invention, the display mother substrate and the flexible touch mother substrate are adhered to each other first and followed by cutting the mother substrate assembly, and so the process step for adhering different display panels to different flexible touch panels repeatedly can be saved. Accordingly, the process steps for manufacturing the flexible touch display panels can be simplified so as to shrink manufacturing time and save manufacturing cost.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
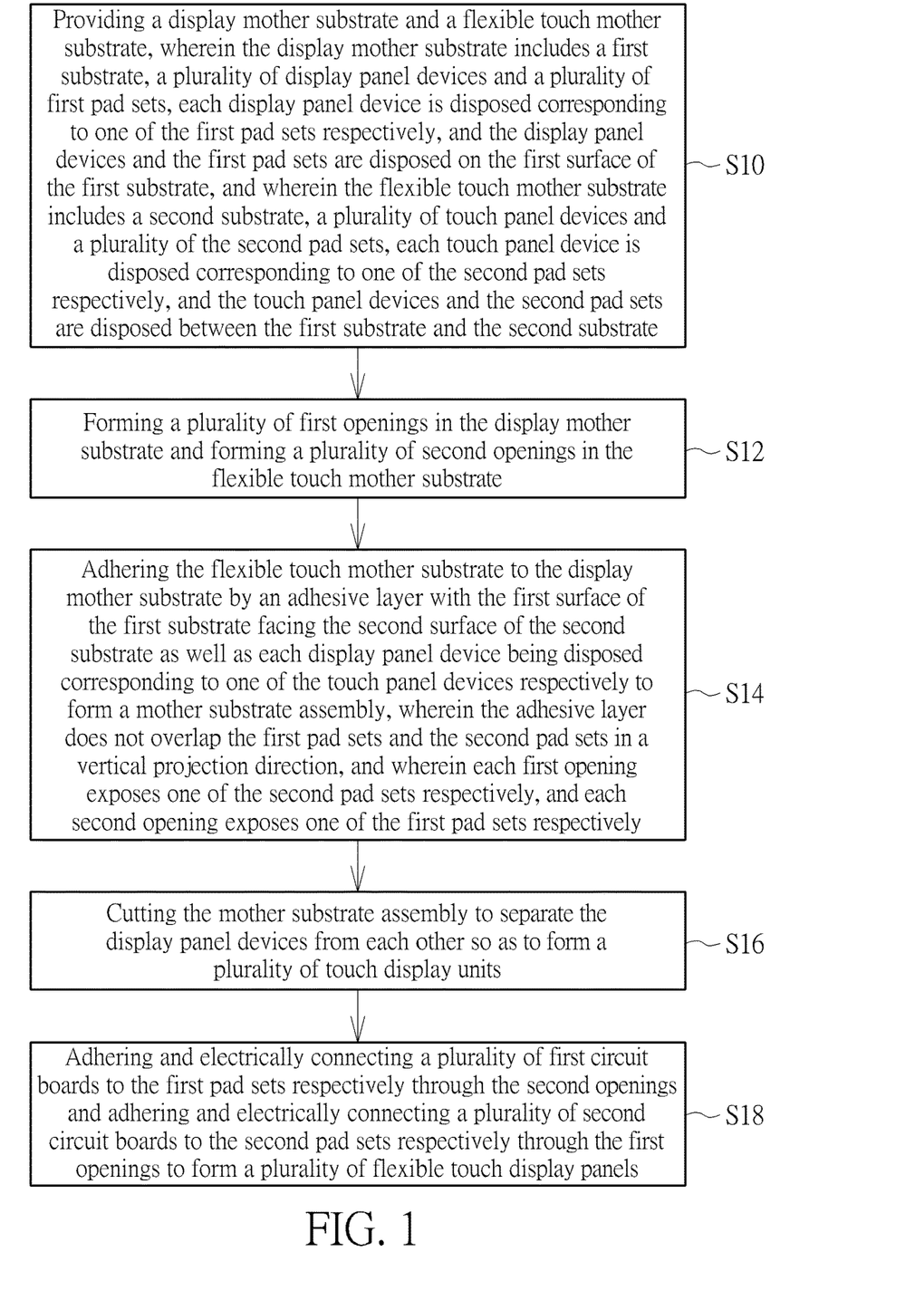
FIG. 1 schematically illustrates a flowchart of a method for manufacturing a flexible touch display panel according to a first embodiment of the present invention.
Figure 2:
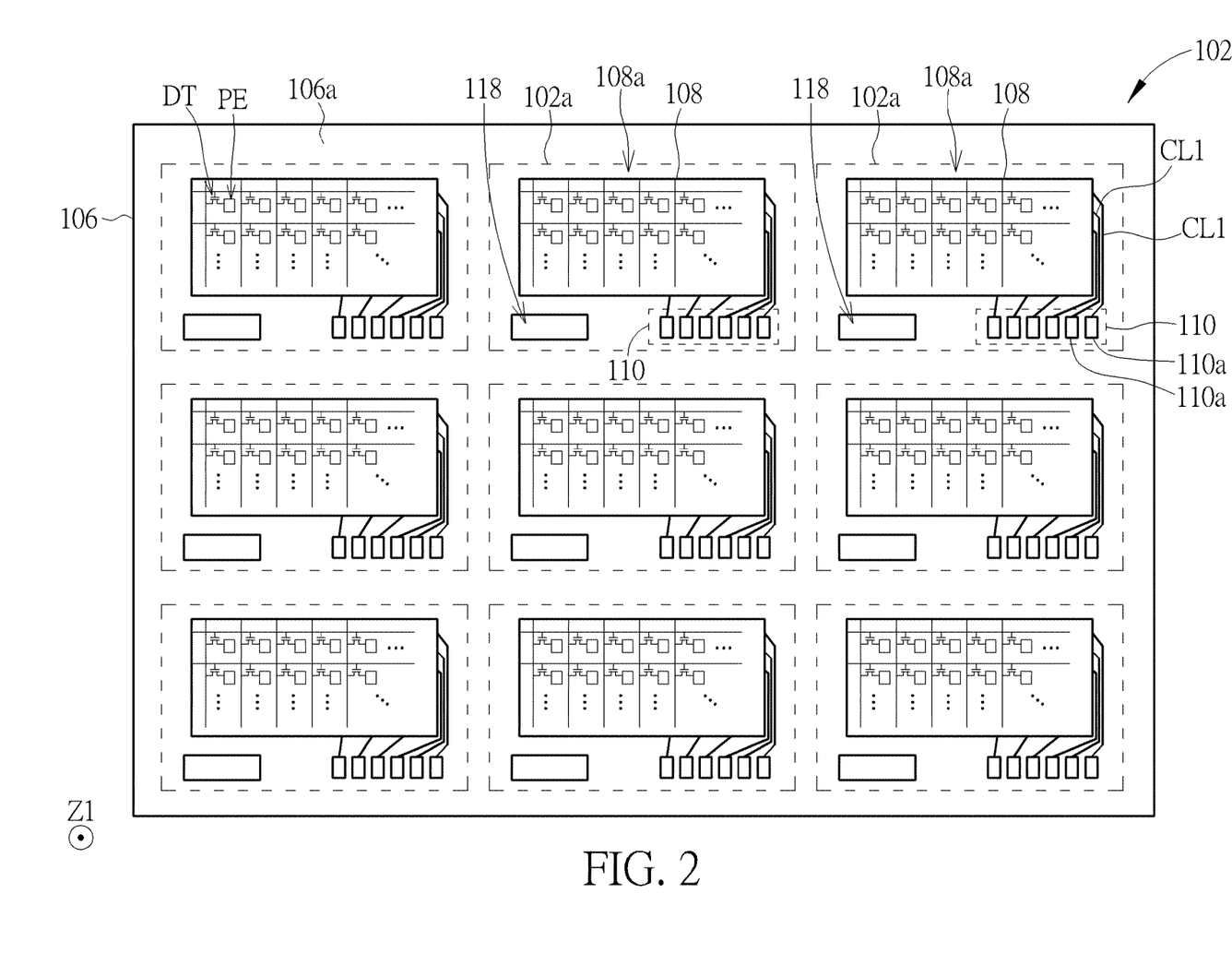
FIG. 2 to FIG. 9 schematically illustrate the method for manufacturing the flexible touch display panel according to the first embodiment of the present invention.
Figure 3:
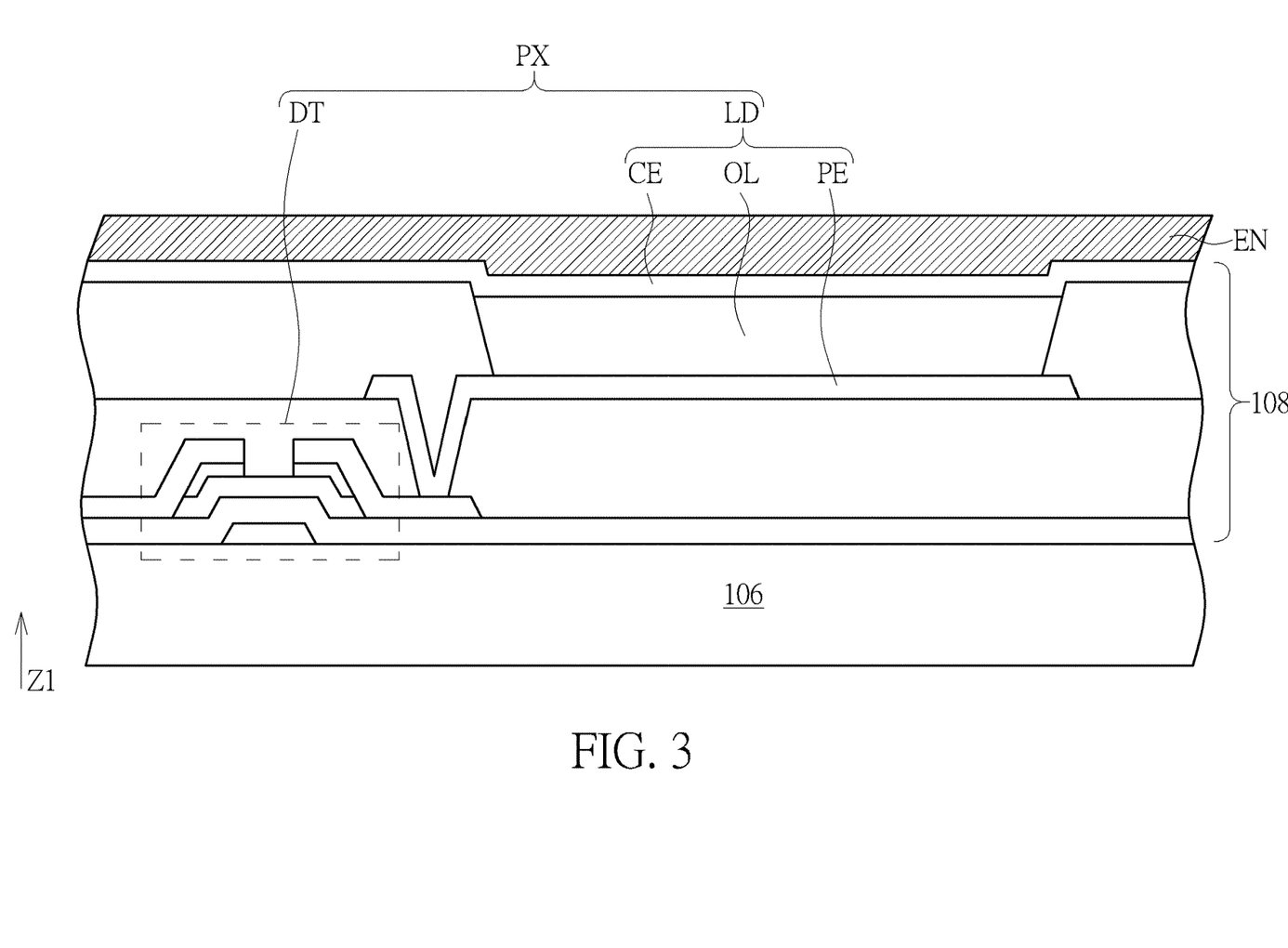
Figure 4:
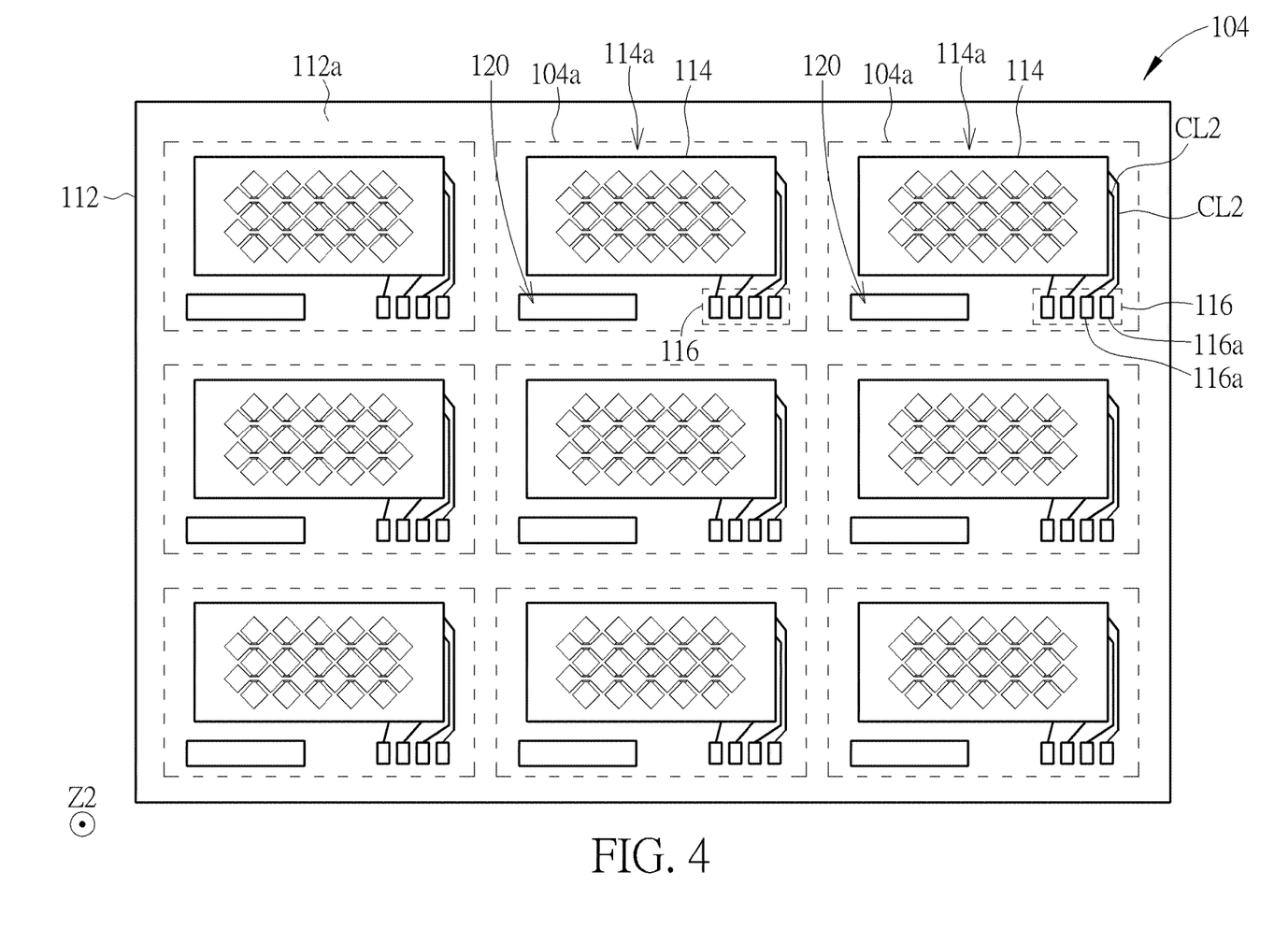
Figure 5:
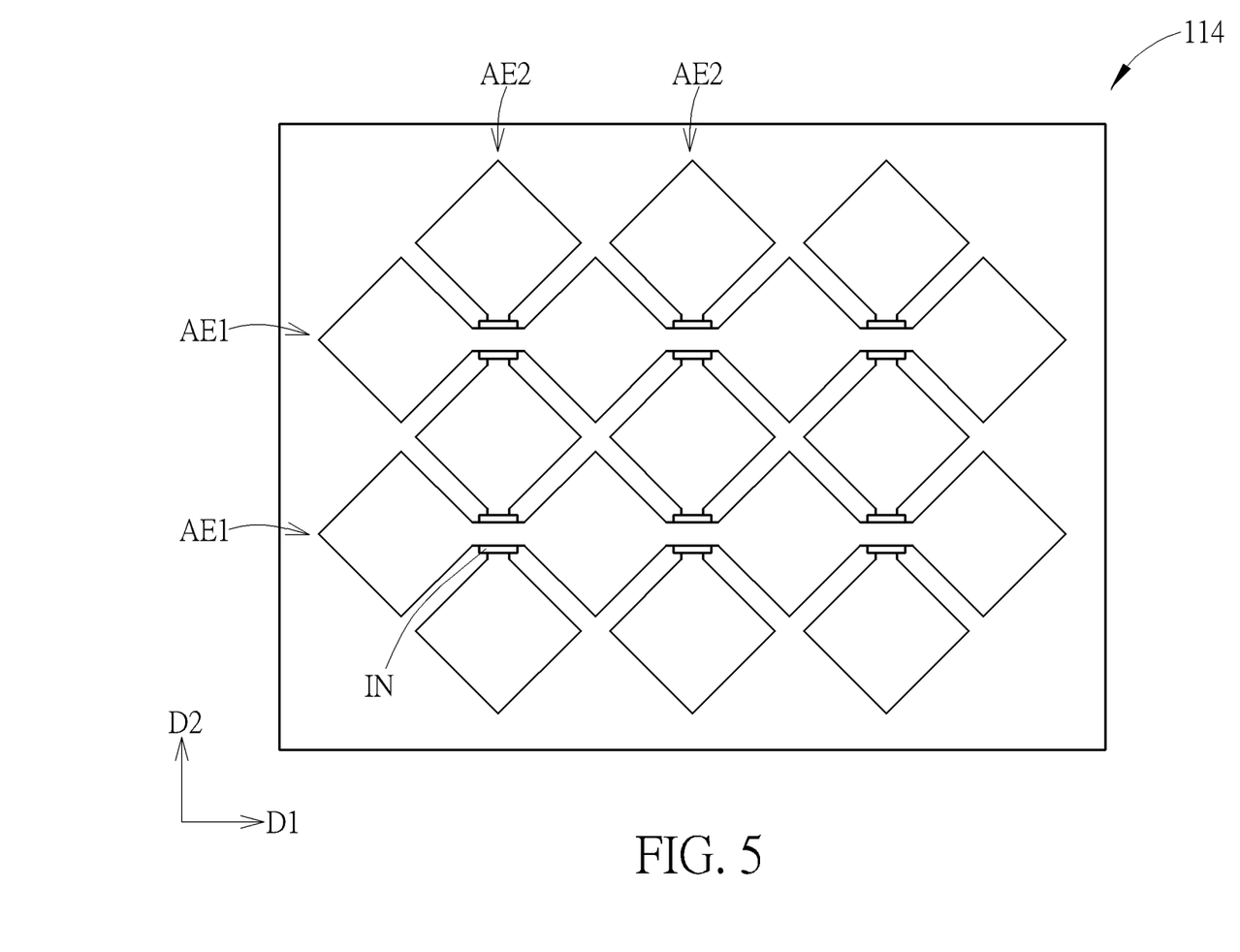
Figure 7:
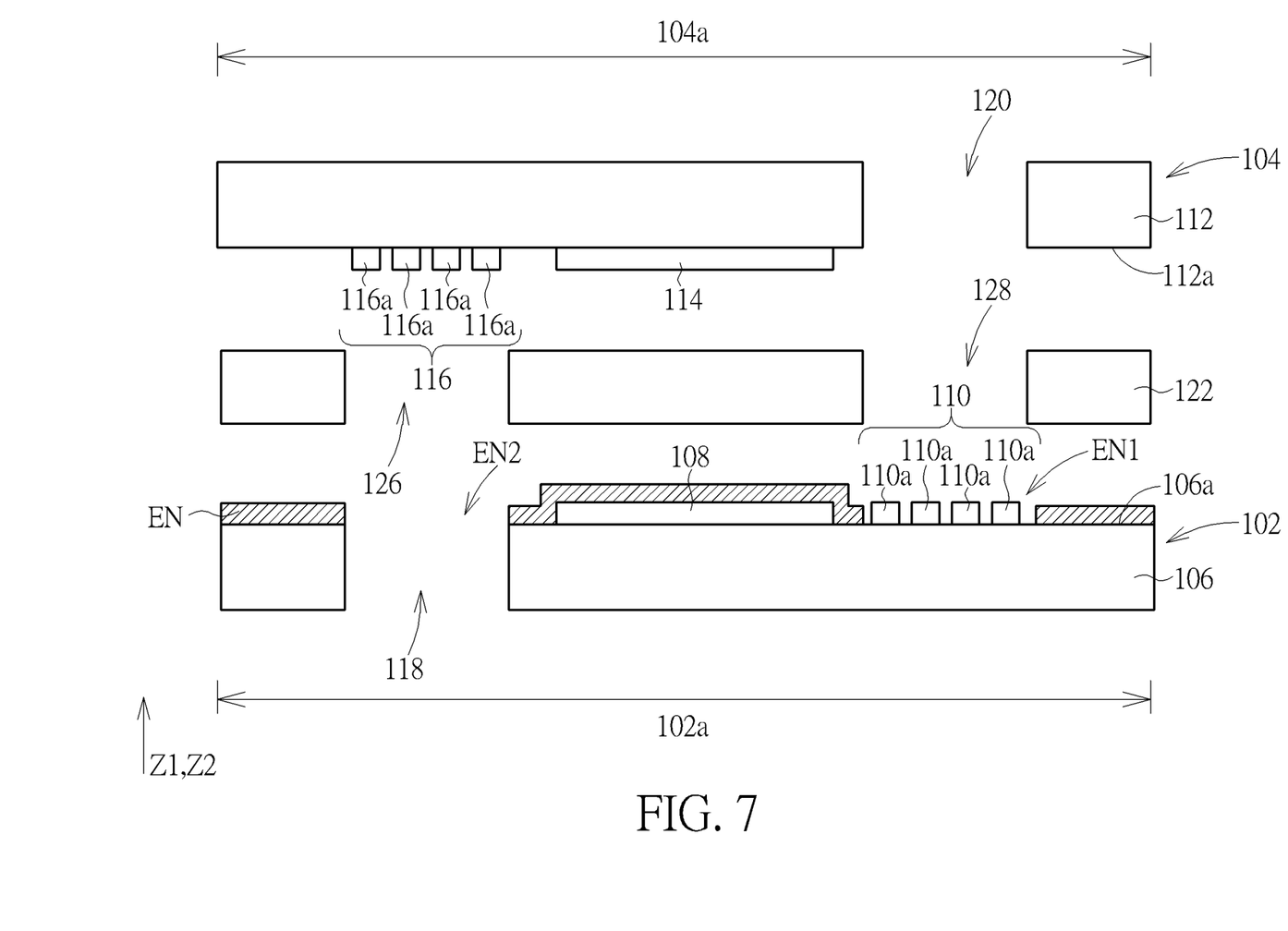
Figure 8:
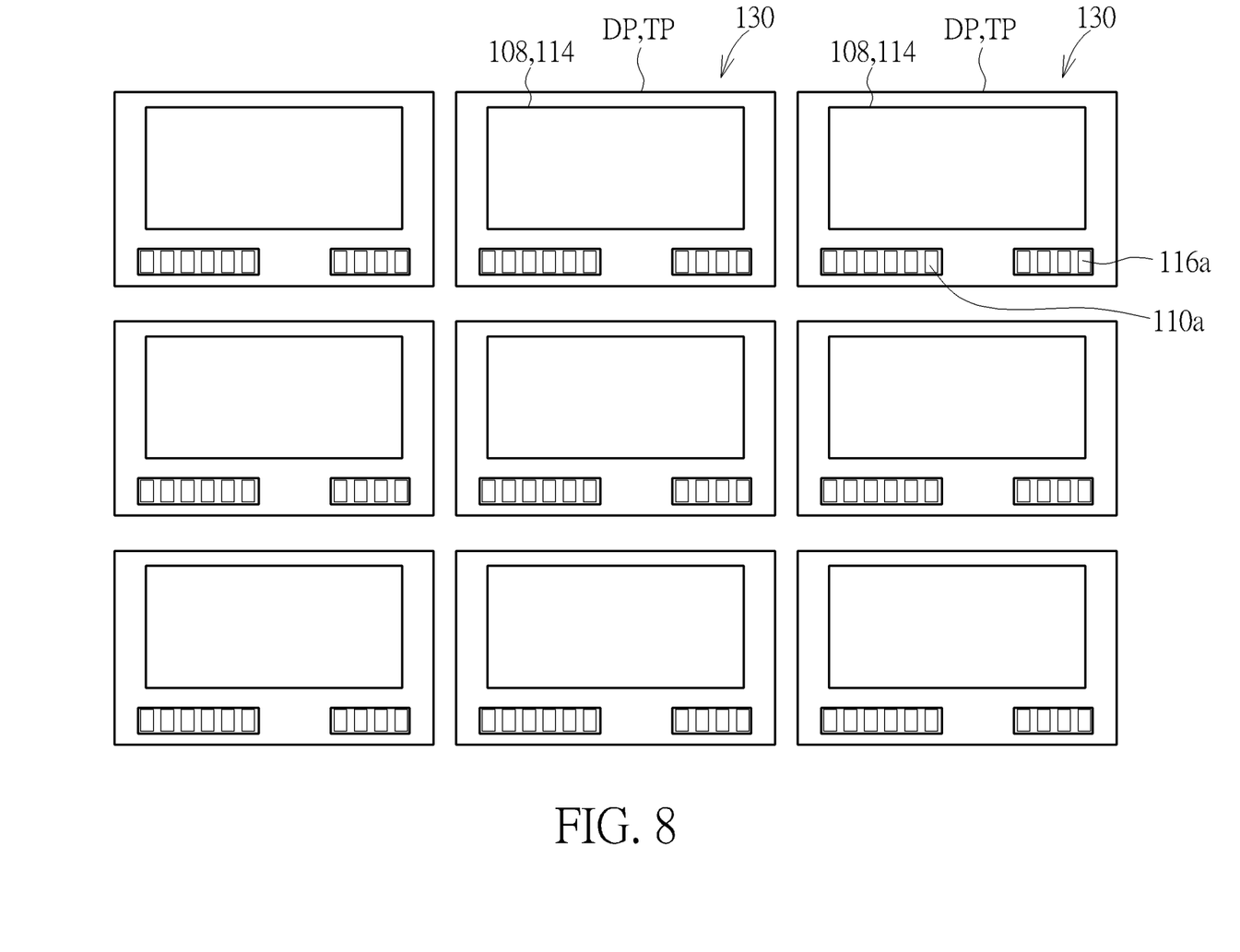
Figure 9:
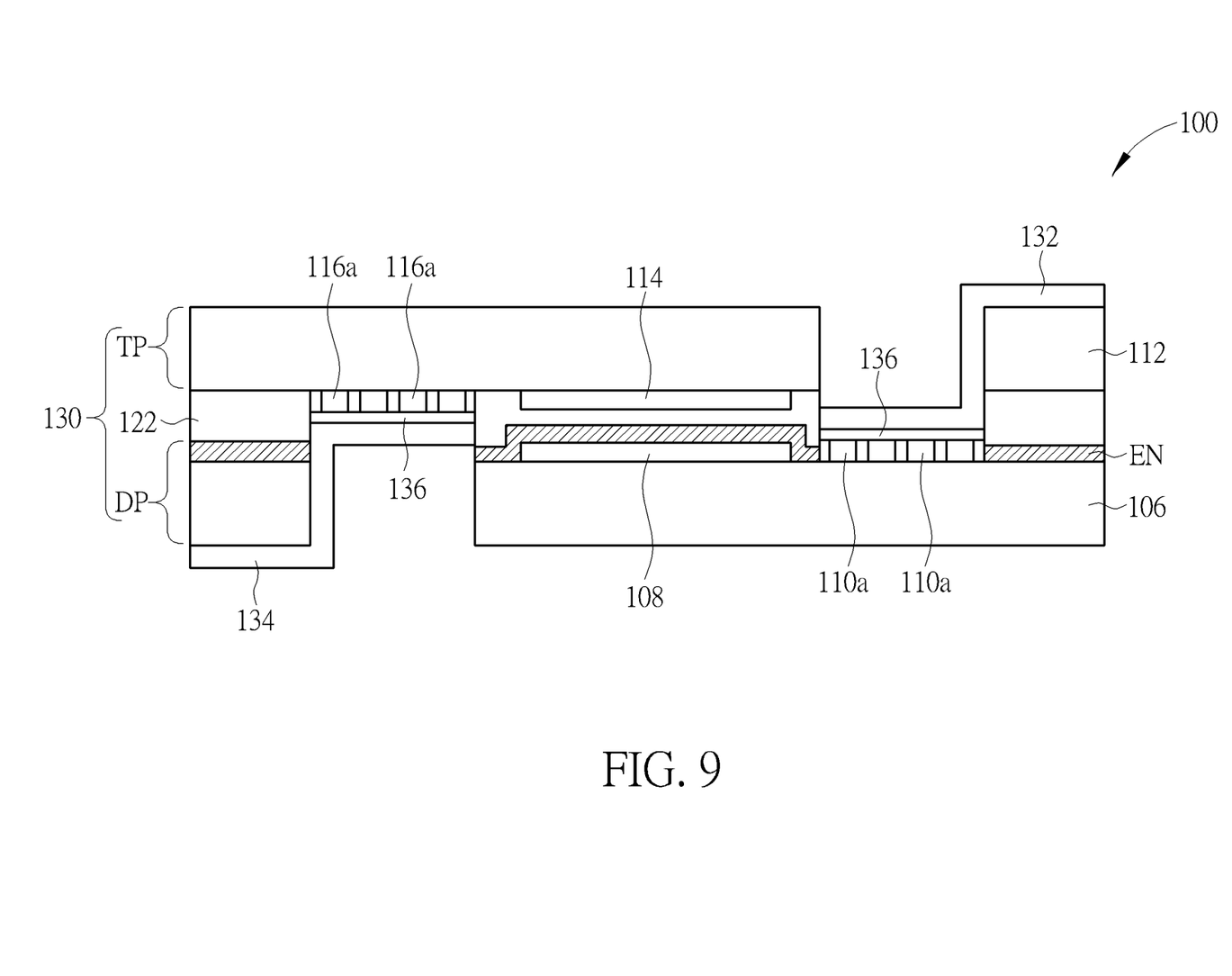

Refer to FIG. 1 to FIG. 9. FIG. 1 schematically illustrates a flowchart of a method for manufacturing a flexible touch display panel according to a first embodiment of the present invention. FIG. 2 to FIG. 9 schematically illustrate the method for manufacturing the flexible touch display panel according to the first embodiment of the present invention, in which FIG. 2 schematically illustrates a top view of a display mother substrate according to the first embodiment, FIG. 3 schematically illustrates a cross-sectional view of single one pixel of the display mother substrate according to an embodiment of the present invention, FIG. 4 schematically illustrates a top view of a flexible touch mother substrate according to the first embodiment, FIG. 5 schematically illustrates a top view of a touch panel device according to an embodiment of the present invention, and FIG. 9 schematically illustrates a cross-sectional view of the flexible touch display panel according to the first embodiment of the present invention. As shown in FIG. 1, the method for manufacturing the flexible touch display panel 100 according to the first embodiment includes the following steps. First, step S10 is performed to provide a display mother substrate 102 and a flexible touch mother substrate 104. As shown in FIG. 2, the display mother substrate 102 may at least include two or more display panel unit regions 102a, and the display mother substrate 102 includes a first substrate 106, a plurality of display panel devices 108 which corresponds to a display region and a plurality of first pad sets 110. Each display panel device 108 is disposed correspondingly to one first pad set 110 respectively, and each display panel device 108 and the corresponding first pad set 110 can be disposed on the first surface 106a of the first substrate 106 in the corresponding display panel unit region 102a. Specifically, each first pad set 110 may include a plurality of first pads 110a, and the display mother substrate 102 may further include a plurality of conductive lines CL1 in each display panel unit region 102a. Each first pad 110a is electrically connected to the corresponding display panel device 108 by each conductive line CL1 respectively, so that each display panel device 108 can be electrically connected to the external circuit.

Furthermore, the first substrate 106 may be selectively a flexible substrate which material may be a flexible material, such as plastic, polyimide (PI), polyethylene terephthalate (PET), cycloolefin copolymer (COC) or polycarbonate (PC), and a bendable radius of the first substrate 106 may be from 1 mm to 10 mm (R1-R10), preferably from 1 mm to 5 mm (R1-R5). For this reason, the display mother substrate 102 can be flexible. Each display panel device 108 may include a plurality of pixels PX used to display a whole frame, and the pixels PX define a range of the display region. For example, the range of each display panel device 108 may serve as the display region, and each first pad set 110 is disposed in a peripheral region 108a of the corresponding display panel unit region 102a. As shown in FIG. 3, each pixel PX may include a switch transistor (not shown in figures), a driving transistor DT and a light-emitting device LD, in which the light-emitting device LD may be for example an organic light-emitting diode that includes a pixel electrode PE, an organic light-emitting layer OL and a cathode CE, but the pixels of the present invention are limited thereto. The light-emitting device LD may also be another self-emissive device, such as an inorganic light-emitting diode or a quantum dot material. In another embodiment, the display panel device 108 may also include another kind of display panel device, such as an electrophoresis display panel device, an electrowetting display panel device, an electro-powder display panel device, a field emission display panel device or a plasma display panel device. Since the organic light-emitting layer OL is self-emissive, and different sub-pixels in one of the pixels PX may include the organic light-emitting layers OL formed of different materials to generate lights with different colors, such as three primary colors, the display mother substrate 102 may not have color filters, but the present invention is not limited thereto. In this embodiment, the display mother substrate 102 may include an encapsulation layer EN covering all of the display panel devices 108 and extending onto the first surface 106a of the first substrate 106, and accordingly, the encapsulation layer EN may encapsulate the display panel devices 108 on the first substrate 106. The encapsulation layer EN has a function of blocking moisture and oxygen so as to prevent the organic light-emitting layers OL of each display panel device 108 from damage caused by the moisture and oxygen before adhering the flexible touch mother substrate 104 to the display mother substrate 102. For instance, the encapsulation layer EN may be a stack or a mixture of organic material or inorganic material, but not limited thereto. The inorganic material may be closer to the display panel device 108 than the organic material, but not limited thereto. The organic material may be for example polyethylene terephthalate (PET), poly(ethylene naphthalate) (PEN) or PI. The inorganic material may be for example silicon oxide, aluminum oxide or silicon nitride. It should be noted that the encapsulation layer EN is formed after the formation of the first pads 110a, and so a plurality of sixth openings EN1 may be formed in the encapsulation layer EN to expose each first pad set 110 respectively in order to avoid the first pads 110a being shielded.

As shown in FIG. 4, the flexible touch mother substrate 104 may at least include two or more touch panel unit regions 104a and further includes a second substrate 112, a plurality of touch panel devices 114 and a plurality of second pad sets 116. Each touch panel device 114 is disposed corresponding to one of the second pad sets 116 respectively, and each touch panel device 114 and the corresponding second pad set 116 can be disposed on the second surface 112a of the second substrate 112 in the corresponding touch panel unit region 104a respectively.

Specifically, each second pad set 116 may include a plurality of second pads 116a, and the flexible touch mother substrate 104 may further include a plurality of conductive lines CL2 in each touch panel unit region 104a. Each second pad 116a is electrically connected to the corresponding touch panel device 114 by each conductive line CL2 respectively, so that each touch panel device 114 can be electrically connected to the external circuit. Each touch panel device 114 can be used to detect a position that the touch object touches or approaches, and an area of each touch panel device 114 may be substantially cover the display region of the corresponding display panel device 108 so as to fully integrate the touch function and the display function. For example, the area of each touch panel device 114 may be greater or equal to the area of the corresponding display panel device 108. In this embodiment, each touch panel device 114 may define a range of a touch sensing region. For example, the range of each touch panel device 114 may serve as the touch sensing region, and each second pad set 116 is disposed in a peripheral region 114a of the corresponding touch panel unit region 102a respectively. Each touch panel device 114 may be for example a mutually capacitive touch panel device, as shown in FIG. 5. Each touch panel device 114 may include a plurality of first axis electrodes AE1 and a plurality of second axis electrodes AE2, in which each first axis electrode AE1 extends along the first direction D1, and each second axis electrode AE2 extends along the second direction D2, so the first axis electrodes AE1 and the second axis electrodes AE2 can cross each other and be capacitively coupled to each other to form sensing units at each crossing respectively. Also, in one touch panel device 114, the first axis electrodes AE1 and the second axis electrodes AE2 can be electrically insulated from each other through an insulation layer IN, in which the second pads 116a may be electrically connected to the first axis electrodes AE1 and the second axis electrodes AE2. Accordingly, each touch panel device 114 can be electrically connected to the external circuit. The first axis electrodes AE1 and the second axis electrode AE2 may be formed of two transparent conductive layers respectively. Each transparent conductive layer may include indium tin oxide, indium zinc oxide, zinc oxide, conductive polymer, carbon nanotube, nanoparticles of indium tin oxide or metal nanowire, but not limited thereto. The touch panel devices of the present invention are not limited to the above-mentioned description. In another embodiment, each touch panel device 114 may also be another kind of touch structure, for example a single layer structure or self-capacitive touch panel device.

The second substrate 112 may be formed of a flexible substrate, such as a plastic substrate, a PI substrate, a PET substrate, a PET substrate, a COC substrate or a PC substrate, and a bendable radius of the second substrate 112 may be from 1 mm to 10 mm (R1-R10), preferably from 1 mm to 5 mm (R1-R5). For this reason, the flexible touch mother substrate 104 can be flexible. For example, the first substrate 104 and the second substrate 112 may be the same. A thickness of the first substrate 104 and a thickness of the second substrate 112 may respectively range from 5 to 60 micrometers. Furthermore, the second substrate 112 may selectively be formed with an anti-fingerprint layer, a hard-coating layer, an anti-glare layer and/or an anti-reflective layer thereon. In another embodiment, the second substrate 112 may also be adhered to a hard or soft third substrate.

Next, step S12 is performed to form a plurality of first openings 118 in the display mother substrate 102 and form a plurality of second openings 120 in the flexible touch mother substrate 104. Each first opening 118 is disposed in the corresponding display panel unit region 102a respectively, and each second opening 120 is disposed in the corresponding touch panel unit region 104a respectively. It should be noted that since the first openings 118 penetrates through the display mother substrate 102 and the second openings 120 penetrates through the flexible touch mother substrate 104, parts of any films formed on the first substrate 106 and the second substrate 112 corresponding to the first openings 118 and the second openings 120 will be removed during the step S12. For restrain the first pads 110a and the second pads 116a from uselessness, the first openings 118 do not overlap the first pads 110a in a vertical projection direction Z1 of the display mother substrate 102. Also, each first opening 118 may be disposed in the peripheral region 108a of the corresponding display panel unit region 102a for preventing the electrical connection between each display panel device 108 and the corresponding first pads 110a and the operation of each display panel device 108 from being affected. The second openings 120 do not overlap the second pads 116a in a vertical projection direction Z2 of the flexible touch mother substrate 104, and each second opening 120 may be disposed in the peripheral region 114a of the corresponding touch panel unit region 104a for preventing the electrical connection between each touch panel device 114 and the corresponding second pads 116a and the operation of each touch panel device 114 from being affected. Further, in the step of forming the first openings 118, a plurality of fifth openings EN2 may be formed in the encapsulation layer EN, and each fifth opening EN2 is disposed corresponding to one of the first openings 118 respectively. In other words, each fifth opening EN2 is included in the corresponding first opening 118.

Figure 6:
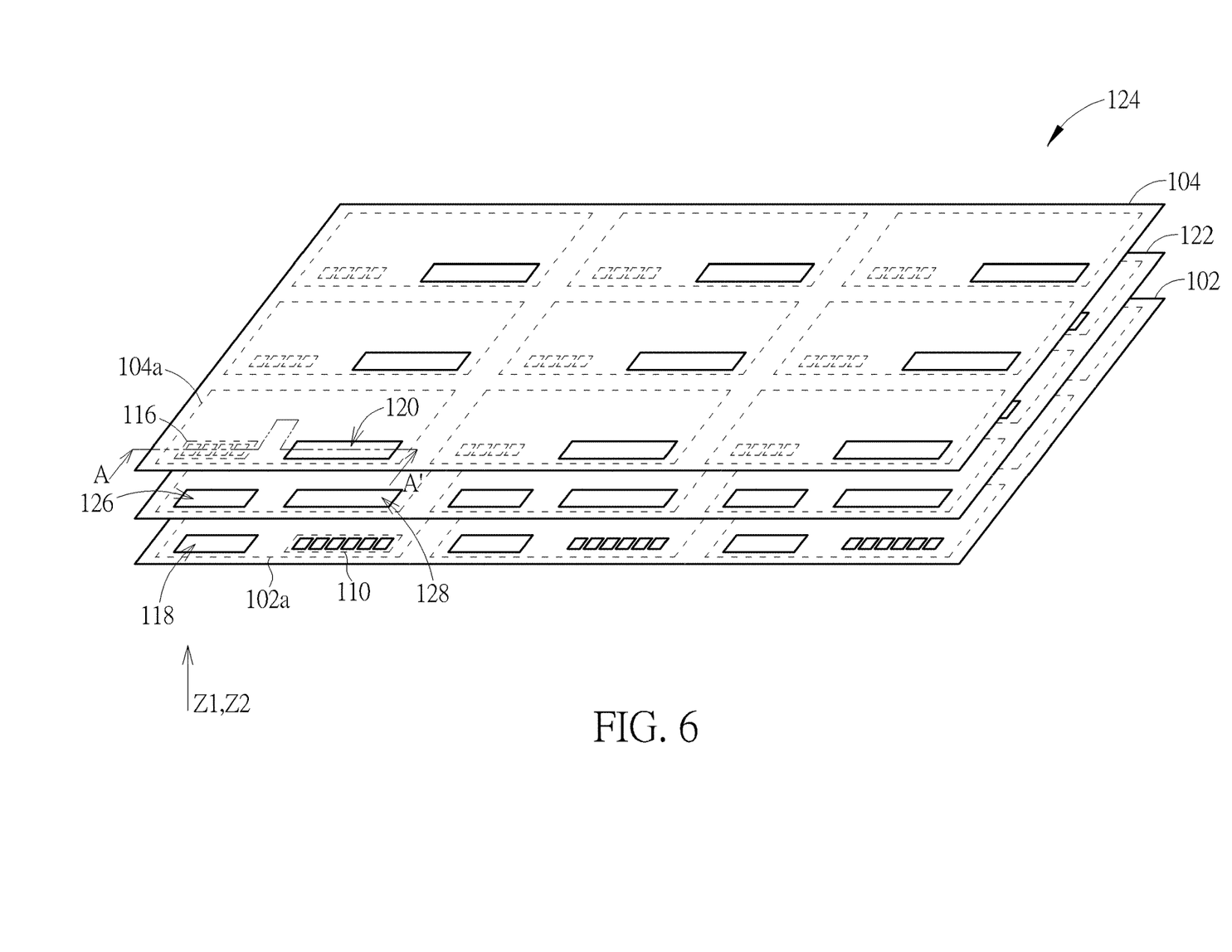

FIG. 7 schematically illustrates a cross-sectional view taken along a cross-sectional line A-A' of FIG. 6. As shown in FIG. 6 and FIG. 7, after forming the first openings 118 and the second openings 120, step S14 is performed to adhere the flexible touch mother substrate 104 to the display mother substrate 102 by an adhesive layer with the first surface 106a of the first substrate 106 facing the second surface 112a of the second substrate, for example turning over the flexible touch mother substrate 104 to make the display panel device 108 of the display mother substrate 102 and the touch panel device 114 of the flexible touch mother substrate 104 to be disposed face to face, as well as each display panel device 108 being disposed corresponding to one of the touch panel devices 114 respectively to form a mother substrate assembly 124. In the mother substrate assembly 124, each first opening 118 is disposed corresponding to one of the second pad sets respectively, and each second opening 120 is disposed corresponding to one of the first pad sets respectively. Since the first openings 118 penetrate through the display mother substrate 102 and the second openings 120 penetrate through the touch mother substrate 104, at least a part or all of the second pads 116a of each second pad set 116 in the vertical projection direction Z1 of the display mother substrate 102 are disposed in the corresponding first opening 118, and at least a part or all of the first pads 110a of each first pad set 110 in the vertical projection direction Z2 of the flexible touch mother substrate 104 (the same as the vertical projection direction Z1 after adhering) are disposed in the corresponding second opening 120. That is, each first opening 118 exposes the corresponding part or the corresponding all of the second pads 116a respectively, and each second opening 120 exposes the corresponding part or the corresponding all of the first pads 110a. Preferably, after adhering, each first opening 118 may expose the corresponding second pad set 116, and each second opening 120 may expose the corresponding the first pad set 110. Moreover, the adhesive layer 122 does not overlap the first pad sets 110 and the second pad sets 116 in the vertical projection direction Z1 of the display mother substrate 102 so as to prevent the following step for electrically connecting the first pad sets 110 and the second pad sets 116 to the circuit boards from being affected. In this embodiment, before adhering the flexible touch mother substrate 104 to the display mother substrate 102, a plurality of third openings 126 and a plurality of fourth openings 128 may be formed on the adhesive layer 122, in which the third openings 126 and the fourth openings 128 penetrate through the adhesive layer 122. Furthermore, in the adhering step, each third opening 126 is disposed corresponding to one of the first openings 118 respectively so as to expose the corresponding second pad set 116, and each fourth opening 128 is disposed corresponding to one of the second openings 120 respectively so as to expose the corresponding first pad set 110. For example, each third opening 126 may be greater than the corresponding first opening 118, and each fourth opening 128 may be greater than the corresponding second opening 120, but not limited thereto. In a condition without shielding the second pad sets 116, each third opening 126 may be smaller or equal to the corresponding first opening 118. In a condition without shielding the first pad sets 110, each fourth opening 128 may be smaller or equal to the corresponding second opening 120. The adhesive layer may include a transparent adhesive film, and a top surface and a bottom surface of the transparent adhesive film may be adhered with a releasing film respectively before adhering, which helps the adhesive layer to form the third openings 126 and the fourth openings 128. After that, the releasing films are removed while adhering. In another embodiment, the size of the adhesive layer may only cover the display panel devices 108 and the touch panel devices 114, and so the adhesive layer may not have the openings.

In addition, in the step of adhering the flexible touch mother substrate 104 to the display mother substrate 102, each touch panel device 114 may cover the corresponding display panel device 108 in the vertical projection direction Z1 of the display mother substrate 102, so that the image displayed by each display panel device 108 can be interacted with user to perform input through the corresponding touch panel device 114. Also, the display panel devices 108 and the touch panel devices 114 do not overlap the first pad sets 110 and the second pad sets 116.

As shown in FIG. 8, step S16 is performed to cut the mother substrate assembly 124 to separate the display panel unit regions 102a from each other, thereby separating the display panel devices 108 to form a plurality of touch display units 130. Since each touch panel unit region 104a is disposed corresponding to the display panel unit region 102a, the touch panel unit regions 104a are also separated from each other in the step S16, and the touch panel devices 114 can be divided. Specifically, the cutting process also cut the display mother substrate 102 into a plurality of display panels DP and a plurality of flexible touch panels TP. In this embodiment, each touch display unit 130 includes one display panel DP and one flexible touch panel TP respectively, in which the display panel DP is adhered to the flexible touch panel TP through the adhesive layer 122. Each display panel DP corresponds to one display panel unit region 102a respectively so as to include one display panel device 108 and one first pad set 110. Each flexible touch panel TP corresponds to one touch panel unit region 104a so as to include one touch panel device 114 and one second pad set 116. Furthermore, the cutting process may be performed along the edges of each display panel unit region 102a, but the present invention is not limited thereto. In another embodiment, the edges of any two adjacent display panel unit regions 102a may be combined to be one edge, and the edges of any two adjacent touch panel unit regions 104a may be combined to be one edge. Accordingly, two adjacent touch display units 130 can be separated only by cutting one time in the cutting process. Also, the cutting range may depend on the requirements. For example, the sizes of the touch display units 130 may be cut to be different, or the touch display units 130 may be cut to include different numbers of the display panel devices 108 and the touch panel device 114.

As shown in FIG. 9, after forming the touch display units 130, step S18 is performed to adhere and electrically connect a plurality of first circuit boards 132 to the first pad sets 110 respectively through the second openings 120 and the fourth openings 128 and adhere and electrically connect a plurality of second circuit boards 134 to the second pad sets 116 respectively through the first openings 118 and the third openings 126 so as to for a plurality of flexible touch display panels 100. For clarity, FIG. 9 shows the connection of single one touch display unit 130, one first circuit board 132 and one second circuit board 134, but the present invention not limited thereto. Each first circuit board 132 and each second circuit board 134 may be flexible circuit boards respectively so as to help the first circuit board 132 and the second circuit board 134 to bend and extend into the openings to be electrically connected to the pads, but not limited thereto. Specifically, each first circuit board 132 may be adhered and electrically connected to the first pads 110a of the corresponding first pad set 110 through an anisotropic conductive film (ACF) 136 respectively, and each second circuit board 134 may be adhered and electrically connected to the second pads 116a of the corresponding second pad set 116 through an anisotropic conductive film 136 respectively. It should be noted that in the method for manufacturing the flexible touch display panel 100 of this embodiment, the display mother substrate 102 is adhered to the flexible touch mother substrate 104 first and followed by cutting the mother substrate assembly 124 into a plurality of the display panels DP and a plurality of the flexible touch panels TP, so that the process for adhering different display panels to different flexible touch panels repeatedly can be saved. Accordingly, the process steps for manufacturing the flexible touch display panels 100 can be simplified so as to reduce manufacturing time and saving manufacturing cost.

In this embodiment, the second substrate 112 can directly serve as a cover substrate that the touch object touches. It is noted that the step of adhering the flexible touch mother substrate 104 to the display mother substrate 102 is performed with the first surface 106a of the first substrate 106 facing the second surface 112a of the second substrate 112 in this embodiment, so that the display panel device 108 and the touch panel device 114 are disposed between the first substrate 106 and the second substrate 112 in the formed flexible touch display panel 100. Thus, the display panel device 108 and the touch panel device 114 can be protected by the first substrate 106 and the second substrate 112, and also, an extra cover substrate can be neglected by directly serving the second substrate 112 as the outmost cover substrate in the flexible touch display panel 100 of this embodiment. Furthermore, since the first circuit board 132 and the second circuit board 134 are disposed in the peripheral region 108a, the operation of the display panel device 108 and the operation of the touch panel device 114 are not affected by the first circuit board 132 and the second circuit board 134.

Figure 10:
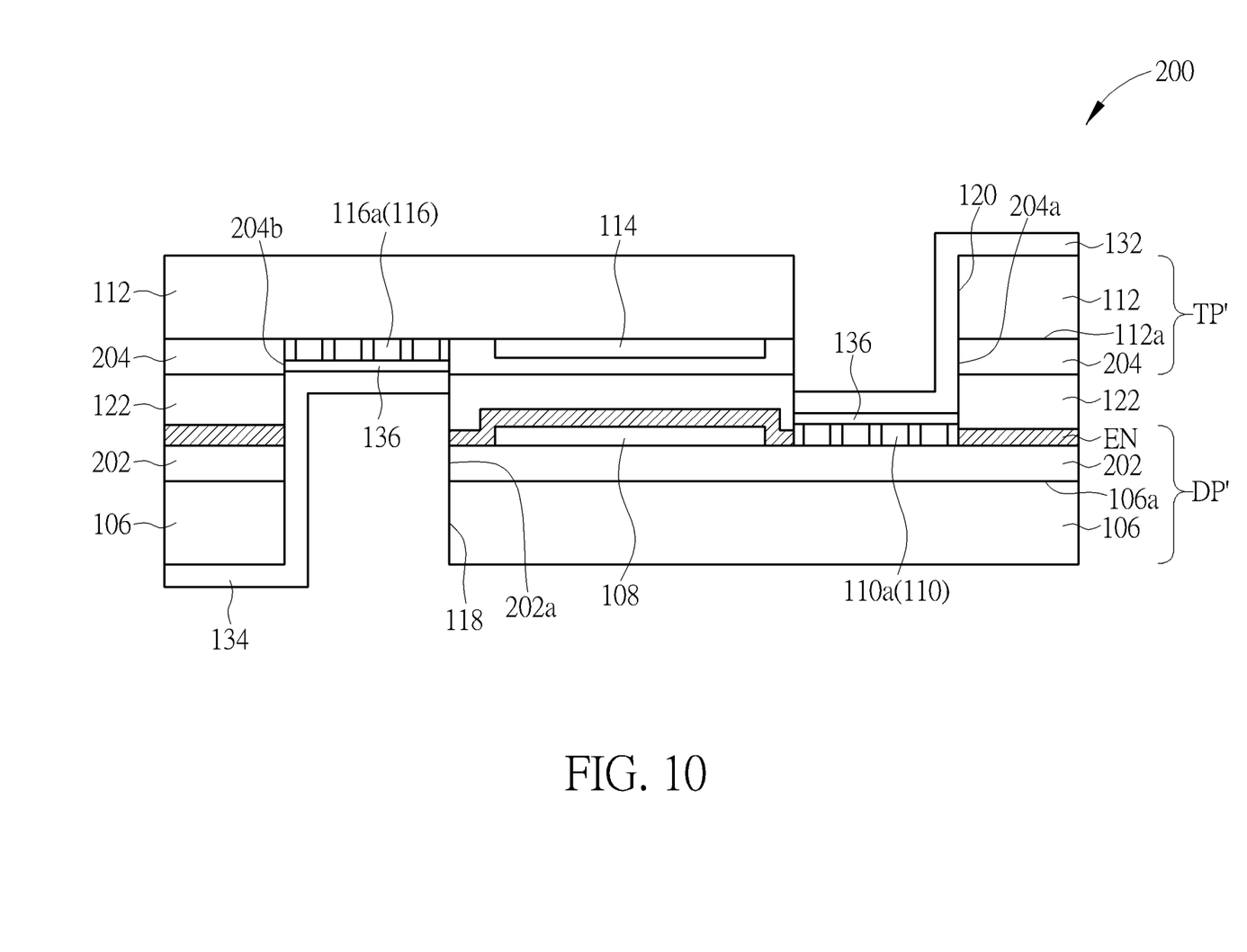
FIG. 10 schematically illustrates a cross-sectional view of a flexible touch display panel according to a second embodiment of the present invention.

Refer to FIG. 10, which schematically illustrates a cross-sectional view of a flexible touch display panel according to a second embodiment of the present invention. As shown in FIG. 10, as compared with the first embodiment, the display mother substrate of this embodiment may further include a first gas barrier layer 202 disposed between the display panel devices 108 and the first substrate 106 and used to block moisture and gas (such as oxygen) outside the first substrate 106 from entering the display panel devices 108 so as to prevent the moisture and oxygen from affecting the electrical performance and the lifetime of the organic light-emitting diode. Specifically, the first gas barrier layer 202 is formed to cover the first surface 106a of the first substrate 106 before forming the display panel devices 108 on the first substrate 106 in this embodiment, so that the first openings 118 penetrate through the first gas barrier layer 202, and the first gas barrier layer 202 may have a plurality of seventh openings 202a disposed corresponding to the first openings 118 respectively and exposing the second pad sets 116 respectively when forming the first openings 118. In this embodiment, the display panel DP' of the formed flexible touch display panel 200 can include the first gas barrier layer 202 having the seventh opening 202a, and the first gas barrier layer 202 and the encapsulation layer EN encapsulate the display panel devices 108 thereby effectively stopping the gas (such as oxygen) and moisture. In another embodiment, the first gas barrier layer 202 may also be formed on a surface of the first substrate 106 opposite to the first surface 106a. The first substrate 106 of this embodiment may be preferably formed of the flexible substrate, and since general flexible substrate has weak gas and moisture blocking function, the first gas barrier layer 202 can be used to block the gas and moisture outside the first substrate 106 in this embodiment. In another embodiment, when the first substrate 106 is formed of glass, the display mother substrate may not have the first gas barrier layer 202.

In addition, the flexible touch mother substrate may further include a second gas barrier layer 204 disposed between the display panel device 108 and the second substrate 112 and used to block the gas and moisture outside the second substrate 112 from affecting the electrical performance and lifetime of the organic light-emitting diode. In this embodiment, the second gas barrier layer 204 is disposed on the second surface 112a of the second substrate 112. Specifically, the second gas barrier layer 204 can be formed to cover the touch panel devices 114 after forming the touch panel devices 114, and thus, the second openings 120 can penetrate through the second gas barrier layer 204 when forming the second openings 120. Accordingly, the second gas barrier layer 204 can have a plurality of eighth openings 204a disposed corresponding to the second openings 120 respectively and exposing the first pad sets 110 respectively. Through the adhesive layer 122, the second gas barrier layer 204 can be adhered to the display panel devices 108, so that the gas and moisture through the second substrate 112 can be blocked. Furthermore, since the second gas barrier layer 204 covers the touch panel devices 114 after the formation of the touch panel devices 114, the second gas barrier layer 204 may further include a plurality of ninth openings 204b disposed corresponding to the first openings 118 respectively and exposing the second pad sets 116 respectively. Thus, the flexible touch panel TP' of this embodiment may include the second gas barrier layer 204 having the eighth openings 204a and the ninth openings 204b. The first gas barrier layer 202 and the second gas barrier layer 204 may be for example a stack or a mixture of organic material or inorganic material, but not limited thereto. The inorganic material may be closer to the display panel device 108 than the organic material, but not limited thereto. The organic material may be for example polyethylene terephthalate (PET), poly(ethylene naphthalate) (PEN) or PI. The inorganic material may be for example silicon oxide, aluminum oxide or silicon nitride. In another embodiment, since both the encapsulation layer EN and the second gas barrier layer 204 can block the gas and moisture outside the second substrate 112 from affecting the organic light-emitting diode, the flexible touch display panel 200 may selectively include the encapsulation layer EN and/or the second gas barrier layer 204, preferably include the encapsulation layer EN. In another embodiment, the second gas barrier may be formed on the second surface 112a of the second substrate 112 before forming the touch panel devices 114, and then, the touch panel devices 114 are formed on the second gas barrier layer 204. Accordingly, the second gas barrier layer 204 may be disposed between the second substrate 112 and the touch panel devices 114, and only have the eighth openings 204a.

Figure 11:
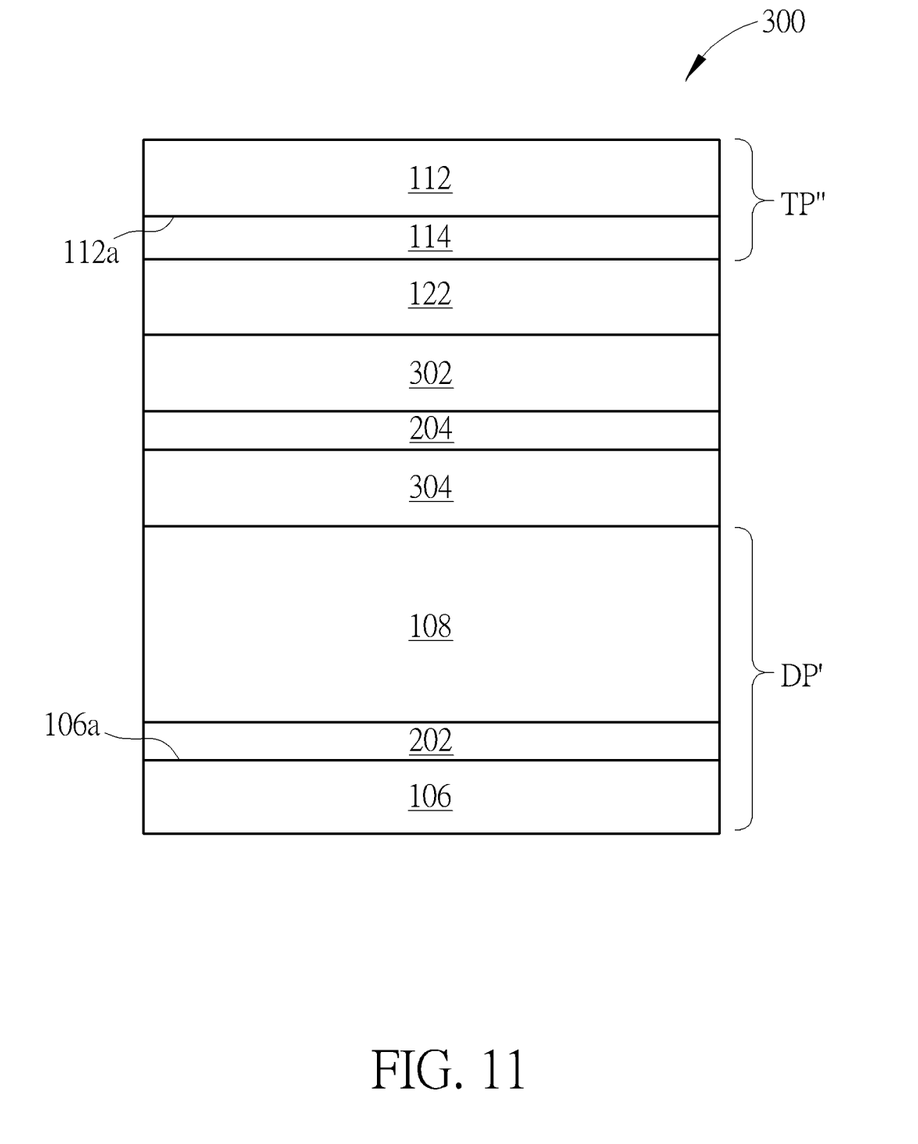
FIG. 11 schematically illustrates a cross-sectional view of a flexible touch display panel according to a third embodiment of the present invention.

Refer to FIG. 11, which schematically illustrates a cross-sectional view of a flexible touch display panel according to a third embodiment of the present invention. For clarity, FIG. 11 shows a region corresponding to the display panel device and the touch panel device, but the present invention not limited thereto. As shown in FIG. 11, as compared with the second embodiment, the flexible touch display panel 300 of this embodiment may further include a third substrate 302 and another adhesive layer 304 disposed between the display panel device 108 and the second substrate 112. Specifically, the second gas barrier layer 204 is formed and disposed on the third substrate 302 and followed by adhering the third substrate 302 to the display mother substrate 104 formed with the display panel device 108 through the adhesive layer 304. Thus, the organic light-emitting diode in the display panel device 108 can be protected by the second gas barrier layer 204 before adhering the flexible touch mother substrate to the display mother substrate. Then, during forming the first openings 118, the first openings 118 also penetrate through the third substrate 302, the second gas barrier layer 204 and the adhesive layer 304.

As the above-mentioned description, in the method for manufacturing the flexible touch display panel of the present invention, the flexible touch mother substrate is adhered to the display mother substrate first and followed by cutting the mother substrate assembly, so that the process steps for adhering different display panels to different flexible touch panels repeatedly can be saved. Accordingly, the process steps for manufacturing the flexible touch display panels can be simplified so as to shrink manufacturing time and save manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a flexible touch display panel, comprising:

providing a display mother substrate and a flexible touch mother substrate, wherein the display mother substrate comprises a first substrate, a plurality of display panel devices and a plurality of first pad sets, each display panel device is disposed corresponding to one of the first pad sets respectively, and the display panel devices and the first pad sets are disposed on the first surface of the first substrate, and wherein the flexible touch mother substrate comprises a second substrate, a plurality of touch panel devices and a plurality of the second pad sets, each touch panel device is disposed corresponding to one of the second pad sets respectively, and the touch panel devices and the second pad sets are disposed between the first substrate and the second substrate;

forming a plurality of first openings in the display mother substrate and forming a plurality of second openings in the flexible touch mother substrate;

adhering the flexible touch mother substrate to the display mother substrate by an adhesive layer with the first surface of the first substrate facing the second surface of the second substrate as well as each display panel device being disposed corresponding to one of the touch panel devices respectively to form a mother substrate assembly, wherein the adhesive layer does not overlap the first pad sets and the second pad sets in a vertical projection direction, and wherein each first opening exposes one of the second pad sets respectively, and each second opening exposes one of the first pad sets respectively;

cutting the mother substrate assembly to separate the display panel devices from each other so as to form a plurality of touch display units; and adhering and electrically connecting a plurality of first circuit boards to the first pad sets respectively through the second openings and adhering and electrically connecting a plurality of second circuit boards to the second pad sets respectively through the first openings to form a plurality of flexible touch display panels, wherein adhering the first circuit boards to the first pad sets and adhering the second circuit boards to the second pad sets are performed after cutting the mother substrate assembly, one of the first circuit boards are adhered to a corresponding one of the first pad sets by an anisotropic conductive film, and one of the second circuit boards are adhered to a corresponding one of the second pad sets by another anisotropic conductive film.

2. The method for manufacturing the flexible touch display panel according to claim 1, further comprising forming a plurality of third openings and a plurality of fourth openings in the adhesive layer before adhering the flexible touch mother substrate to the display mother substrate, wherein each third opening is disposed corresponding to one of the first openings respectively, and each fourth opening is disposed corresponding to one of the second openings respectively.

3. The method for manufacturing the flexible touch display panel according to claim 2, wherein each third opening is greater than the one of the first openings, and each fourth opening is greater than the one of the second openings.

4. The method for manufacturing the flexible touch display panel according to claim 1, wherein the anisotropic conductive film is in contact with the adhesive layer, and the another anisotropic conductive film is in contact with the adhesive layer.

5. The method for manufacturing the flexible touch display panel according to claim 1, wherein the display mother substrate further comprises an encapsulation layer covering the display panel devices and extending onto the first surface of the first substrate, forming the first opening further comprises forming a plurality of fifth openings in the encapsulation layer, each fifth opening is disposed corresponding to one of the first openings respectively, and the method further comprises forming a plurality of sixth openings in the encapsulation layer to expose each first pad set respectively before forming the first openings.

6. The method for manufacturing the flexible touch display panel according to claim 1, wherein the display mother substrate further comprises a first gas barrier layer disposed between the display panel devices and the first substrate.

7. The method for manufacturing the flexible touch display panel according to claim 6, wherein the first gas barrier layer has a plurality of seventh openings, and each seventh opening corresponds to one of the first openings and exposes one of the second pad sets.

8. The method for manufacturing the flexible touch display panel according to claim 1, wherein the flexible touch mother substrate further comprises a second gas barrier layer, and the method further comprises forming the second gas barrier layer on the second surface of the second substrate before adhering the flexible touch mother substrate to the display mother substrate.

9. The method for manufacturing the flexible touch display panel according to claim 8, wherein the second gas barrier layer has a plurality of eighth openings and a plurality of ninth openings, each eighth opening corresponds to one of the second openings and exposes one of the first pad sets, and each ninth opening corresponds to one of the first openings and exposes one of the second pad sets.

10. The method for manufacturing the flexible touch display panel according to claim 1, wherein the flexible touch display panel further comprises a third substrate and a second gas barrier layer disposed between the display panel devices and the second substrate, and the method further comprises forming the second gas barrier layer on the third substrate and adhering the third substrate to the display mother substrate before adhering the flexible touch mother substrate to the display mother substrate.

11. The method for manufacturing the flexible touch display panel according to claim 1, wherein each touch display unit comprises a display panel and a flexible display panel, and the display panel is adhered to the flexible display panel through the adhesive layer.

12. The method for manufacturing the flexible touch display panel according to claim 1, wherein the second substrate is directly touched by a touch object.

13. The method for manufacturing the flexible touch display panel according to claim 1, wherein at least one of the first substrate or the second substrate is a flexible substrate.

14. The method for manufacturing the flexible touch display panel according to claim 1, wherein each display panel device comprises a plurality of light-emitting devices.

* * * * *